US012787700B2

(12) United States Patent
Wada

(10) Patent No.: US 12,787,700 B2
(45) Date of Patent: Nov. 3, 2026

(54) TRANSPORT VEHICLE COMPRISING A FIRST HOLDER MEMBER, A SECOND HOLDER MEMBER, AND A HOLDER DRIVE BELOW A SUPPORT

(71) Applicant: Daifuku Co., Ltd., Osaka (JP)

(72) Inventor: Yoshinari Wada, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 221 days.

(21) Appl. No.: 18/628,204

(22) Filed: Apr. 5, 2024

(65) Prior Publication Data

US 2024/0339346 A1 Oct. 10, 2024

(30) Foreign Application Priority Data

Apr. 10, 2023 (JP) ................................ 2023-063296

(51) Int. Cl.
*H10P 72/30* (2026.01)
*B66C 19/00* (2006.01)

(52) U.S. Cl.
CPC .......... *H10P 72/3214* (2026.01); *B66C 19/00* (2013.01); *H10P 72/3221* (2026.01); *H10P 72/3216* (2026.01); *H10P 72/3218* (2026.01)

(58) Field of Classification Search
CPC . B66C 19/00; H01L 21/677; H01L 21/67703; H01L 21/67724; H01L 21/67733; B65G 1/0457; H10P 72/3214; H10P 72/3221
See application file for complete search history.

(56) References Cited

U.S. PATENT DOCUMENTS

| | | | | |
|---|---|---|---|---|
| 9,576,832 | B2 * | 2/2017 | Tomida | H01L 21/67733 |
| 11,697,577 | B2 * | 7/2023 | Abe | H01L 21/67736 414/467 |
| 12,087,607 | B2 * | 9/2024 | Tomida | H01L 21/6773 |
| 12,106,990 | B2 * | 10/2024 | Kobayashi | B66C 1/28 |
| 12,139,176 | B2 * | 11/2024 | Kobayashi | B66C 13/04 |
| 2016/0133488 | A1 * | 5/2016 | Tomida | H01L 21/6773 212/71 |
| 2019/0229003 | A1 | 7/2019 | Kesil | |
| 2022/0112063 | A1 * | 4/2022 | Abe | B66F 19/00 |
| 2022/0208583 | A1 * | 6/2022 | Tomida | H01L 21/67724 |

(Continued)

FOREIGN PATENT DOCUMENTS

| | | | |
|---|---|---|---|
| JP | 2000255969 | A | 9/2000 |
| JP | 2022177495 | A | 12/2022 |

(Continued)

*Primary Examiner* — Robert W Hodge
*Assistant Examiner* — Juan J Campos, Jr.
(74) *Attorney, Agent, or Firm* — The Webb Law Firm

(57) ABSTRACT

A transport vehicle includes a holder and a lifter. The lifter includes an elongated member and a lifting unit. The holder includes a support, at least one first holder member, at least one second holder member, and a holder drive. The first holder member and the second holder member are located below the support. The holder drive is located in a space in a vertical direction below the support. The space includes the first holder member and the second holder member. The elongated member fastener fastening an elongated member to the support is located on the support. The elongated member fastener protrudes downward from the support.

7 Claims, 5 Drawing Sheets

(56) References Cited

U.S. PATENT DOCUMENTS

2023/0134312 A1* 5/2023 Kobayashi ........ H01L 21/67379
198/803.7
2023/0140218 A1* 5/2023 Kobayashi .......... H01L 21/6773
414/814
2024/0002148 A1* 1/2024 Kobayashi ........ H01L 21/67733
2024/0059486 A1* 2/2024 Kinugawa ......... H01L 21/67259
2024/0067448 A1* 2/2024 Kinugawa ......... H01L 21/67379

FOREIGN PATENT DOCUMENTS

WO 2021181923 A1 9/2021
WO 2021181924 A1 9/2021

* cited by examiner

TRANSPORT VEHICLE COMPRISING A FIRST HOLDER MEMBER, A SECOND HOLDER MEMBER, AND A HOLDER DRIVE BELOW A SUPPORT

CROSS-REFERENCE TO RELATED APPLICATION

This application claims priority to Japanese Patent Application No. 2023-063296 filed Apr. 10, 2023, the disclosure of which is hereby incorporated by reference in its entirety.

BACKGROUND OF THE INVENTION

Field of the Invention

The present invention relates to a transport vehicle that travels along a travel path to transport an article.

Description of Related Art

An example of such a transport vehicle is described in Japanese Unexamined Patent Application Publication No. 2022-177495 (Patent Literature 1). Reference signs in parentheses used below in describing the background are the reference signs in Patent Literature 1.

A transport vehicle (1) described in Patent Literature 1 includes a holding unit (7) that holds a flange (201) on a front opening unified pod, or FOUP (200), and a lifting drive unit (6) that winds and unwinds multiple belts (B) connected to the holding unit (7) to lift and lower the holding unit (7). The transport vehicle (1) also includes a pair of grippers (12). The pair of grippers (12) are opened or closed in the horizontal direction by a drive inside the holding unit (7) to hold the flange (201) on the FOUP (200). The transport vehicle (1) with the above structure can transfer the FOUP (200) to and from a load port (300) located below the travel path.

In the structure described in Patent Literature 1, the pair of grippers (12) for holding the FOUP (200) protrude downward from a base (11) of the holding unit (7). The structure tends to be larger in the vertical direction. Additionally, as shown in FIG. 2 in Patent Literature 1, belt fasteners for fastening the belts (B) to the holding unit (7) protrude upward from a housing (13) of the holding unit (7). Thus, when the holding unit (7) is at its highest position nearest the lifting drive unit (6), a space at least having the size of the belt fastener is left between the holding unit (7) and the lifting drive unit (6) in the vertical direction. The structure described in Patent Literature 1 thus tends to be larger in the vertical direction.

SUMMARY OF THE INVENTION

In response to the above, transport vehicles downsized in the vertical direction are awaited.

A technique responding to the above issue provides the structure described below.

A transport vehicle for traveling along a travel path to transport an article includes a holder that holds a handle on the article, and a lifter that lifts and lowers the holder. The lifter includes an elongated member suspending the holder and a lifting drive that winds and unwinds the elongated member to lift and lower the holder. The holder includes a support being a plate suspended parallel to a horizontal plane by the elongated member, at least one first holder member and at least one second holder member supported by the support and movable toward and away from each other, and a holder drive that drives the at least one first holder member and the at least one second holder member. The at least one first holder member and the at least one second holder member are located below the support. The holder drive is located in a space in a vertical direction below the support. The space includes the at least one first holder member and the at least one second holder member. The transport vehicle includes an elongated member fastener on the support. The elongated member fastener fastens the elongated member to the support. The elongated member fastener protrudes downward from the support.

In this structure, the first holder member and the second holder member are located below the support, and the holder drive is located in the space in the vertical direction including the first holder member and the second holder member. This allows the components of the holder to be efficiently located together below the support, allowing the entire holder to be easily downsized in the vertical direction. Additionally, the elongated member fastener for fastening the elongated member and the support together protrudes downward from the support. This allows fewer components to be located above the support, allowing the holder located inside the compartment to be nearer the lifting drive in the vertical direction. The entire transport vehicle can thus also be downsized in the vertical direction.

Further features and advantageous effects of the technique according to the present disclosure will be apparent from exemplary and nonlimiting embodiments described below with reference to the drawings.

BRIEF DESCRIPTION OF THE DRAWINGS

The terms Fig., Figs., Figure, and Figures are used interchangeably in the specification to refer to the corresponding figures in the drawings

DESCRIPTION OF THE INVENTION

A transport vehicle travels along a travel path to transport an article. A transport vehicle according to one or more embodiments will now be described. The transport vehicle is used in a transport facility in one or more embodiments.

Figure 1:
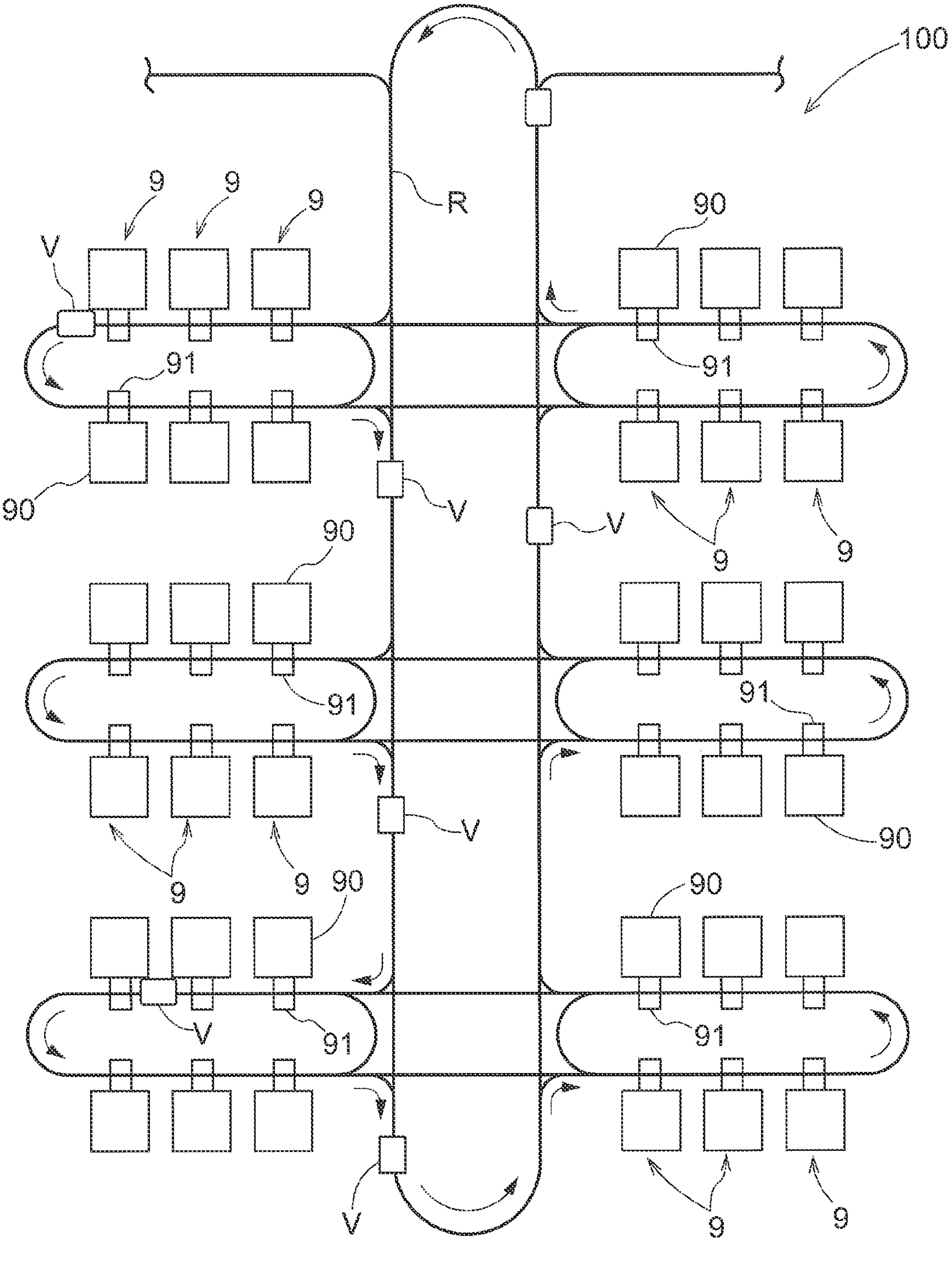
FIG. 1 is a plan view of a transport facility.
Figure 2:
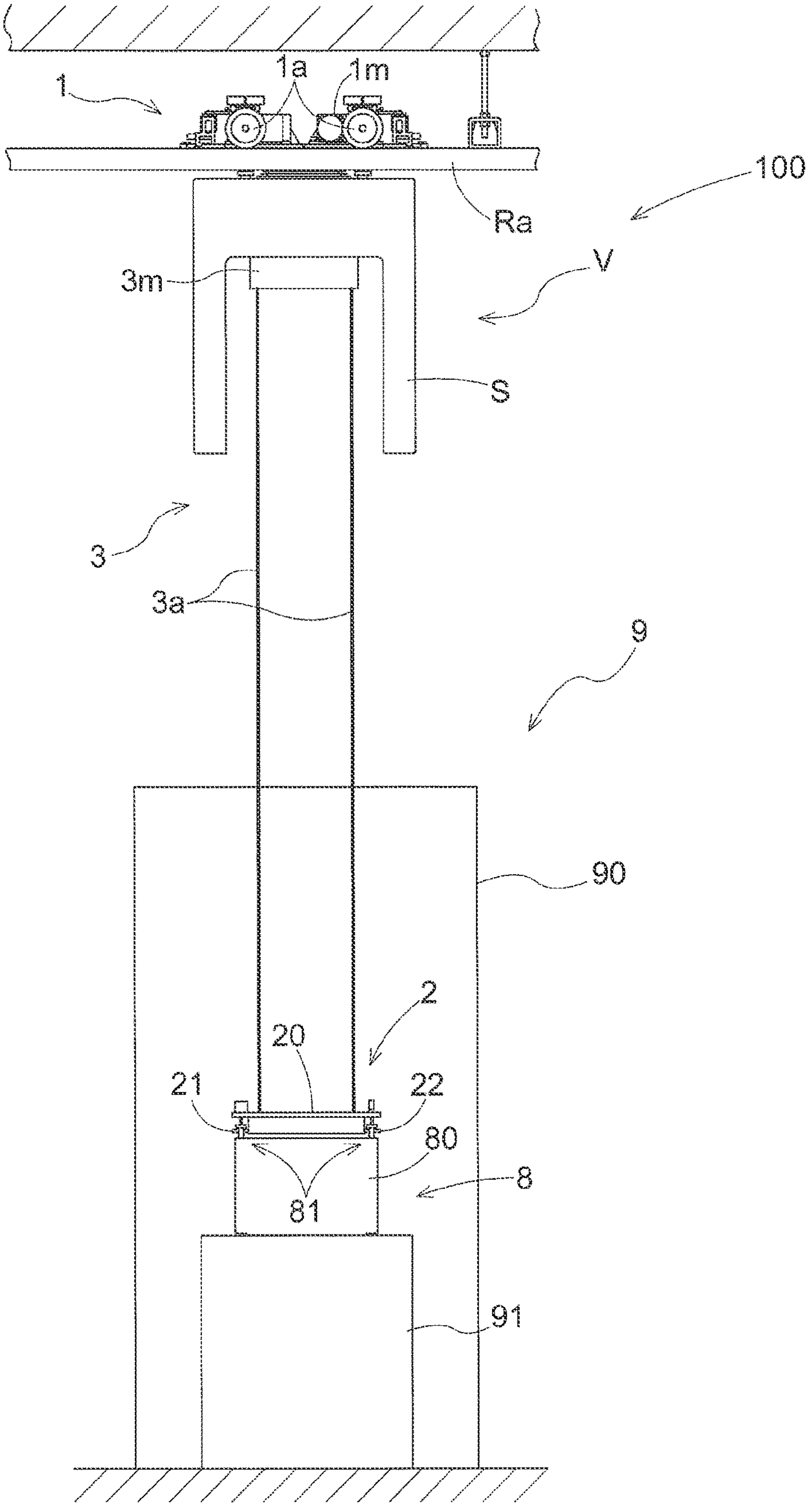
FIG. 2 is a diagram describing a transfer operation.

As shown in FIGS. 1 and 2, a transport facility 100 includes a predefined travel path R, one or more transport vehicles V that each travel on the travel path R to transport an article 8, and multiple transfer areas 9 defined along the travel path R.

The travel path R is spaced upward from the floor surface. In the present embodiment, the travel path R includes a travel rail Ra installed near the ceiling. The transport vehicle V is installed on the ceiling to travel along the travel rail Ra. The transfer areas 9 are located below the travel path R. The transport vehicle V lifts and lowers the article 8 and transfers the article 8 to and from the transfer areas 9.

In the present embodiment, the transport facility 100 includes multiple transport vehicles V. Each of the multiple transport vehicles V performs, in response to a transport command provided from a host controller (not shown) that centrally manages the facility, a task corresponding to the transport command. For example, the transport command includes information about a transfer source and a transfer destination of an article 8. A transport vehicle V receives such a transport command and transports an article 8 from its transfer source to its transfer destination. The transfer source and the transfer destination include the transfer areas 9.

The transport facility 100 handles various articles 8. In the present embodiment, the transport facility 100 is used in a semiconductor fabrication plant. The articles 8 are thus, for example, substrate containers (front opening unified pods, or FOUPs) containing substrates (e.g., wafers and panels) or reticle containers (reticle pods) containing reticles. In this case, the transport vehicles V transport, between processes, the articles 8 such as substrate containers or reticle containers along the travel path R.

In the present embodiment, each transfer area 9 includes a processing device 90 that processes an article 8 and a mount 91 adjacent to the processing device 90. Processing an article 8 herein refers to processing objects (substrates or reticles) contained in the article 8 as a container. Each transport vehicle V receives an article 8 that has been processed by the processing device 90 from the mount 91 or delivers an article 8 that has yet to be processed by the processing device 90 to the mount 91. The processing device 90 perform various processes such as thin film formation, photolithography, and etching.

As shown in FIG. 2, each transport vehicle V includes a traveler 1 that travels on the travel rail Ra and a compartment S that contains an article 8. The transport vehicle V also includes a holder 2 that holds handles 81 on the article 8 and a lifter 3 that lifts and lowers the holder 2.

In the present embodiment, the traveler 1 includes multiple travel wheels 1*a* that roll on the travel rail Ra and a travel wheel drive 1*m* that drives at least one or more of the travel wheels 1*a*. The travel wheel drive 1*m* is, for example, an electric motor.

In the present embodiment, the compartment S is hung from the traveler 1 below the travel rail Ra. The compartment S can contain an article 8 held by the holder 2. For the transport vehicle V to transport the article 8 along the travel path R, the article 8 is accommodated in the compartment S. For the article 8 to be contained in the compartment S, the holder 2 holding the article 8 is lifted by the lifter 3 to its highest position.

In the present embodiment, the lifter 3 includes a lift belt 3*a* (an example of an elongated member) that suspends the holder 2 and a lifting drive 3*m* that winds and unwinds the lift belt 3*a* to lift and lower the holder 2. In the present embodiment, the lifter 3 includes four lift belts 3*a*. FIG. 2 shows two of the four lift belts 3*a*. Although not shown in detail, the lifting drive 3*m* includes a rotator around which the lift belts 3*a* are wound and a drive source that rotates the rotator. The rotator rotates in the forward direction or in the reverse direction to wind or unwind the lift belts 3*a*. This causes the holder 2 connected to the lift belts 3*a* to be lifted or lowered. The lifting drive 3*m* is covered with a case.

The holder 2 holds the handles 81 on the article 8. The holder 2 includes a first holder member 21 and a second holder member 22. The first holder member 21 and the second holder member 22 hold the handles 81 on the article 8.

Figure 3:
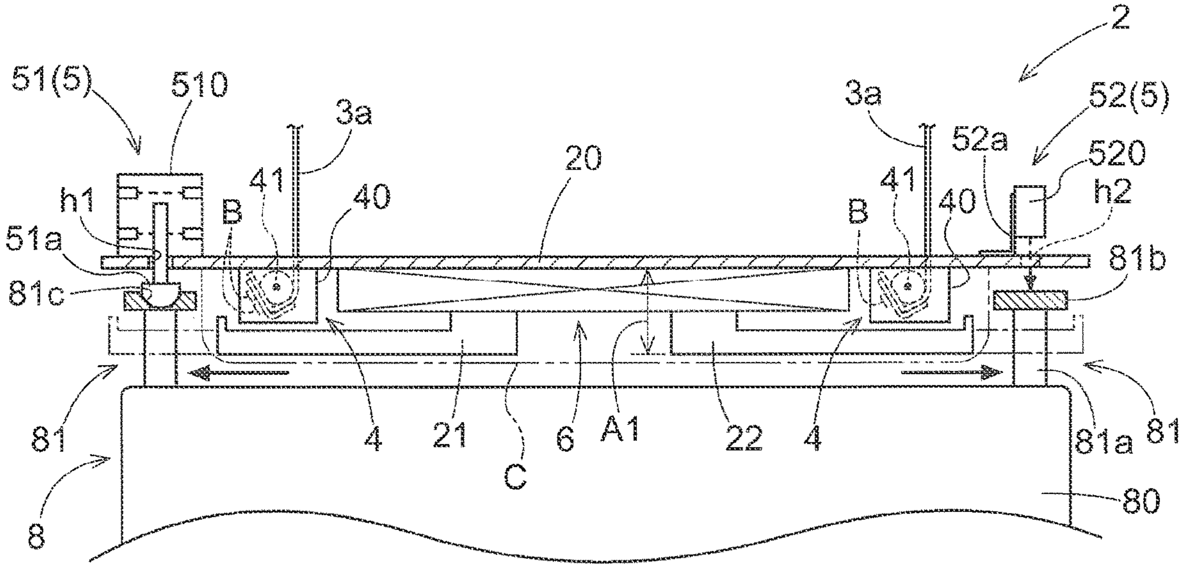
FIG. 3 is a diagram describing a holding operation.

In the present embodiment, as shown in FIG. 3, the article 8 includes a body 80 and the handles 81. The body 80 is a box for containing objects. The handles 81 are held by the holder 2 in the transport vehicle V.

In the present embodiment, a pair of handles 81 protrude upward from the upper surface of the body 80. The pair of handles 81 each include multiple poles 81*a* extending from the upper surface of the body 80 and a plate 81*b* connecting the upper ends of the multiple poles 81*a*. The multiple poles 81*a* included in each handle 81 are arranged in the direction into the page of FIG. 3.

The plate 81*b* is elongated in the direction in which the multiple poles 81*a* are arranged (in the direction into the page of FIG. 3). The plate 81*b* has a flat upper surface. The plate 81*b* has a recess 81*c* recessed downward on its upper surface.

The holder 2 includes a support 20 being a plate suspended parallel to the horizontal plane by the lift belts 3*a*, the first holder member 21 and the second holder member 22 supported by the support 20 and movable toward and away from each other, and a holder drive 6 that drives the first holder member 21 and the second holder member 22. In the present embodiment, the holder 2 includes a case C covering a space below the support 20. The case C is attached to the support 20 and covers at least the holder drive 6. In the present embodiment, the case C also covers parts of the first holder member 21 and the second holder member 22.

In the present embodiment, the first holder member 21 and the second holder member 22 move in the horizontal direction. In other words, the first holder member 21 and the second holder member 22 move toward and away from each other in the horizontal direction.

In the present embodiment, the first holder member 21 and the second holder member 22 move away from each other between the pair of handles 81, which are holding targets, to hold the pair of handles 81 at positions inward from the handles 81 in the horizontal direction. The first holder member 21 and the second holder member 22 move toward each other to release the pair of handles 81.

In the present embodiment, the support 20 includes article detectors 5 that detect the article 8 as a holding target for the holder 2. In response to the article detectors 5 detecting the article 8, the holder 2 determines the position of the article 8 and performs a holding operation on the article 8.

In the present embodiment, the article detectors 5 include a first detector 51 and a second detector 52. The first detector 51 detects one of the pair of handles 81 on the article 8. The second detector 52 detects the other of the pair of handles 81 on the article 8. The first detector 51 and the second detector 52 have different structures for detecting the article 8.

The first detector 51 comes in contact with a handle 81 on the article 8 to detect the position of the article 8. In the present embodiment, the first detector 51 includes a contact member 51*a* and a first sensor 510.

The contact member 51*a* extends in the vertical direction through a hole h1 in the support 20 and moves in the vertical direction relative to the support 20. When the holder 2 is lowered toward the article 8 in a transfer area 9, the contact member 51*a* comes in contact with the handle 81 on the article 8 from above. The contact member 51*a* has its lower end that fits into the recess 81*c* on the handle 81. When the handle 81 pushes the lower end of the contact member 51*a* upward, the entire contact member 51*a* moves upward relative to the support 20.

The first detector 51 is located on the upper surface of the support 20. The first detector 51 detects the contact member 51*a* moving upward relative to the support 20. The first detector 51 at least detects the contact member 51*a* coming in contact with the handle 81. The first detector 51 also detects the vertical relative positions of the holder 2 and the handle 81 based on the amount of upward movement of the contact member 51*a* relative to the support 20. In the present embodiment, the first detector 51 includes a light emitter and a light receiver and, based on whether the optical axis is blocked by the contact member 51*a*, detects the amounts of movement of the contact member 51*a* relative to the handle 81 and relative to the support 20.

The second detector 52 detects a handle 81 on the article 8 in a contactless manner to detect the position of the article 8. In the present embodiment, the second detector 52 includes a support member 52*a* and a second sensor 520 supported by the support member 52*a*.

The support member 52*a* is located on the upper surface of the support 20. The support member 52*a* supports the second sensor 520 above the support 20. In the example in the figure, the support member 52*a* is an L-shaped bracket.

The second sensor 520 is located above the support 20. As described above, the second sensor 520 is supported by the support member 52*a*. The second sensor 520 detects the vertical relative distance between the holder 2 and the handle 81 in a contactless manner. In the present embodiment, the second sensor 520 is an optical range sensor and emits light downward. Light emitted from the second sensor 520 travels through a hole h2 in the support 20 and reaches the handle 81. This allows the second sensor 520 to detect the vertical relative distance between the holder 2 and the handle 81.

When lowering toward the article 8 in the transfer area 9, the holder 2 determines its relative position to the article 8 based on the detection results obtained by the two detectors having different detection structures, or in other words, the contact first detector 51 and the contactless second detector 52. The holder 2 can thus accurately identify its relative position to the article 8. Upon lowering to a position at which the pair of handles 81 on the article 8 are holdable, the holder 2 moves the first holder member 21 and the second holder member 22 to hold the pair of handles 81.

The arrangement of the components included in the transport vehicle V will now be described.

As shown in FIG. 3, the first holder member 21 and the second holder member 22 are located below the support 20. In the present embodiment, the first holder member 21 includes a pair of first holder members 21, and the second holder member 22 includes a pair of second holder members 22 (refer to FIGS. 7 and 8). The pair of first holder members 21 and the pair of second holder members 22 are located below the support 20.

The holder drive 6 is located in a space A1 in the vertical direction below the support 20. The space A1 includes the first holder members 21 and the second holder members 22. In other words, the holder drive 6 is located in the space A1 between the support 20 and the lower ends of the first holder members 21 and the second holder members 22 in the vertical direction. This structure allows the components included in the holder 2 to be efficiently located together below the support 20. The entire holder 2 can thus be easily downsized in the vertical direction.

Figure 4:
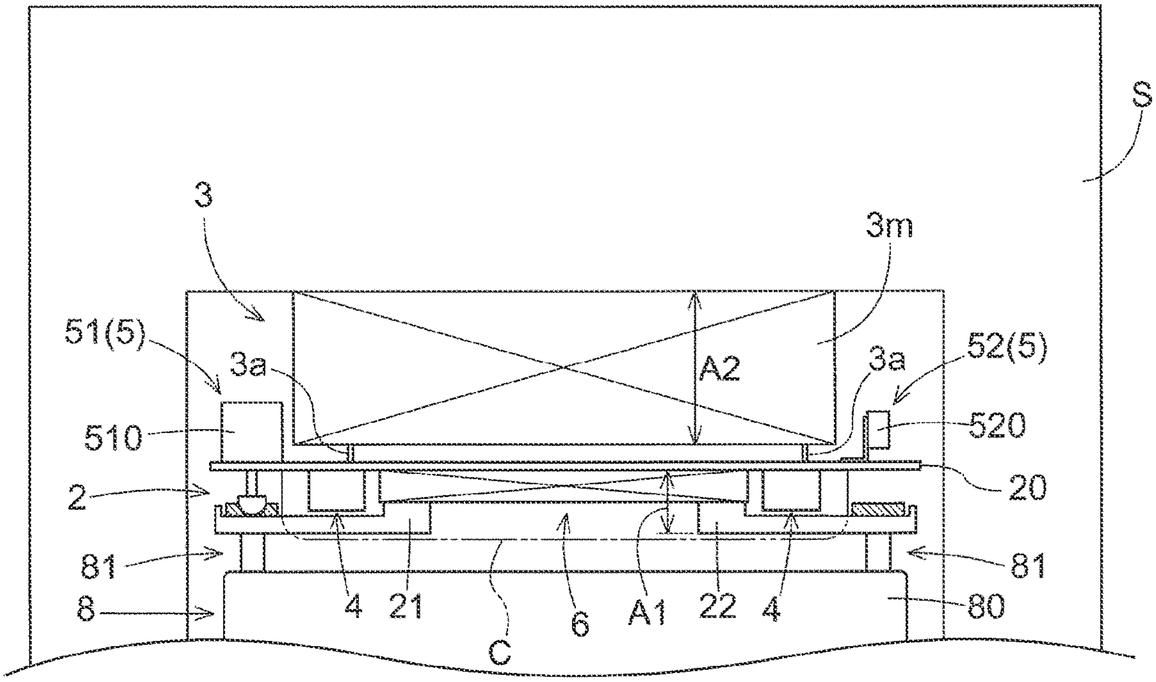
FIG. 4 is a diagram of a holder and a lifting drive being nearest each other.

The support 20 includes belt fasteners 4 (examples of an elongated member fastener) for fastening the lift belts 3*a* to the support 20. Each belt fastener 4 protrudes downward from the support 20. This structure can reduce the number of components located above the support 20. This allows, as shown in FIG. 4, the holder 2 and the lifting drive 3*m* to be near each other in vertical direction when the holder 2 is inside the compartment S. The entire transport vehicle V can thus be easily downsized in the vertical direction.

In the present embodiment, each belt fastener 4 includes a fixed wall 40 protruding downward from the support 20 and a rotator 41 rotatable relative to the fixed wall 40 at a predetermined angle. The lift belt 3*a* is fastened to the rotator 41 with bolts B (also refer to FIG. 6). For example, the rotator 41 is rotatable at a predetermined angle of 30 degrees forward or backward from its reference phase. This allows the lift belt 3*a* to be tightened or loosened to adjust the levelness of the support 20 suspended by the multiple (four in this example) lift belts 3*a*. As described above, the lifter 3 in the present embodiment includes four lift belts 3*a*. The support 20 thus includes four belt fasteners 4 corresponding to the four lift belts 3*a* (also refer to FIG. 5).

In the present embodiment, the article detectors 5 protrude upward from the support 20. As described above, the article detectors 5 in the present embodiment include the first detector 51 and the second detector 52. The first detector 51 and the second detector 52 each include a portion above the support 20. More specifically, the first sensor 510 in the first detector 51 protrudes upward from the support 20. The support member 52*a* in the second detector 52 also protrudes upward from the support 20. The second sensor 520 in the second detector 52 is supported by the support member 52*a* and thus located above the support 20.

In the present embodiment, as shown in FIG. 4, when the support 20 is nearest the lifting drive 3*m* in the vertical direction, the article detectors 5 are located at positions overlapping a space A2 in the vertical direction including the lifting drive 3*m* without overlapping the lifting drive 3*m* as viewed in the vertical direction. In other words, with the holder 2 lifted by the lifter 3 at its highest position, the article detectors 5 are at positions overlapping the space A2 in the vertical direction including the lifting drive 3*m* but not overlapping the lifting drive 3*m* as viewed in the vertical direction. This structure can avoid interference between the lifting drive 3*m* and the article detectors 5 and allows the support 20 to be near the lifting drive 3*m* in the vertical direction.

In the present embodiment, when the support 20 is nearest the lifting drive 3*m* in the vertical direction, the lifting drive 3*m* is between the first sensor 510 in the first detector 51 and the second sensor 520 in the second detector 52 in the horizontal direction.

Figure 5:
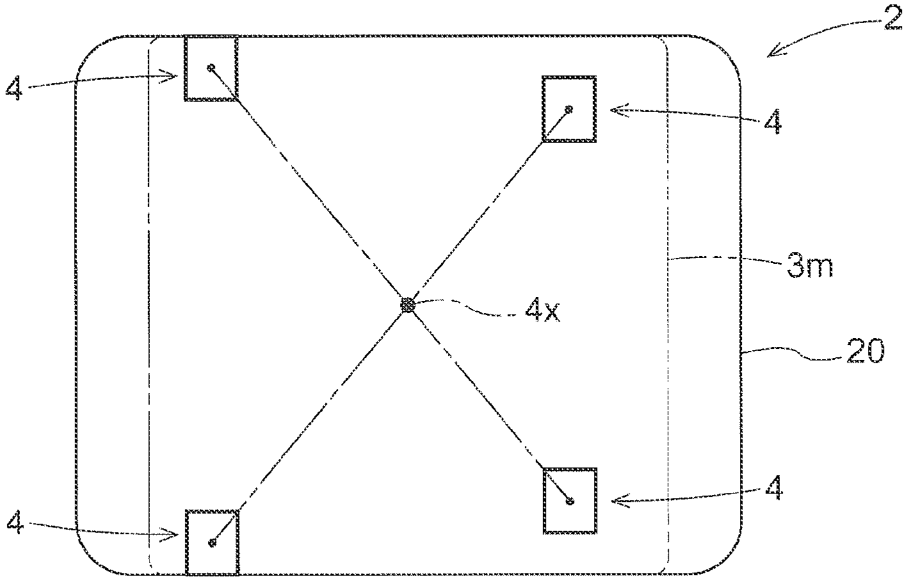
FIG. 5 is a diagram showing the center of gravity of a figure having belt fasteners as its vertices as viewed in the vertical direction.

In the present embodiment, as shown in FIG. 5, the support 20 includes four belt fasteners 4. The lift belts 3*a* are connected to the respective belt fasteners 4. The four belt fasteners 4 are arranged based on the center of gravity of the article 8. More specifically, the four belt fasteners 4 are located at positions determined to reduce the amount of vertical misalignment between the center of gravity 4*x* (centroid) of a figure having the four belt fasteners 4 as its vertices as viewed in the vertical direction and the center of gravity (center of mass) of the article 8 held by the holder 2. This allows the holder 2 holding the article 8 to easily maintain a horizontal orientation.

Figure 6:
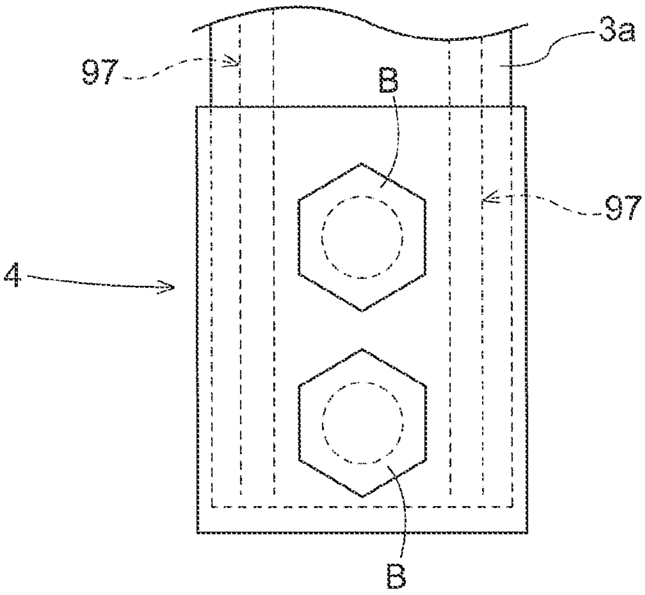
FIG. 6 is a diagram of a belt, showing its fastening structure.

As shown in FIG. 6, one or more of the lift belts 3*a* include feed lines 97 for supplying power to the holder 2. The feed line 97 supplies the holder 2 with, for example, power provided from another feed line located along the travel rail Ra (refer to FIG. 2) in a contactless manner. In the present embodiment, one of the four lift belts 3*a* includes the feed line 97.

The feed line 97 extends in a direction in which the lift belt 3*a* extends. In the present embodiment, the lift belt 3*a* including the feed line 97 is fastened to the belt fastener 4 with multiple bolts B arranged in the direction in which the lift belt 3*a* extends. This allows the bolts B to easily fasten the lift belt 3*a* at a position not interfering with the feed line 97 extending in the direction in which the lift belt 3*a* extends. In the example in the figure, two bolts B arranged in the direction in which the lift belt 3*a* extends fasten the lift belt 3*a* to the belt fastener 4. The other lift belts 3*a* including no feed line 97 may each include multiple bolts B arranged in a width direction of the lift belt 3*a* and be fastened to the corresponding belt fastener 4 with the bolts B. This allows the lift belts 3*a* to be fastened stably.

Figure 7:
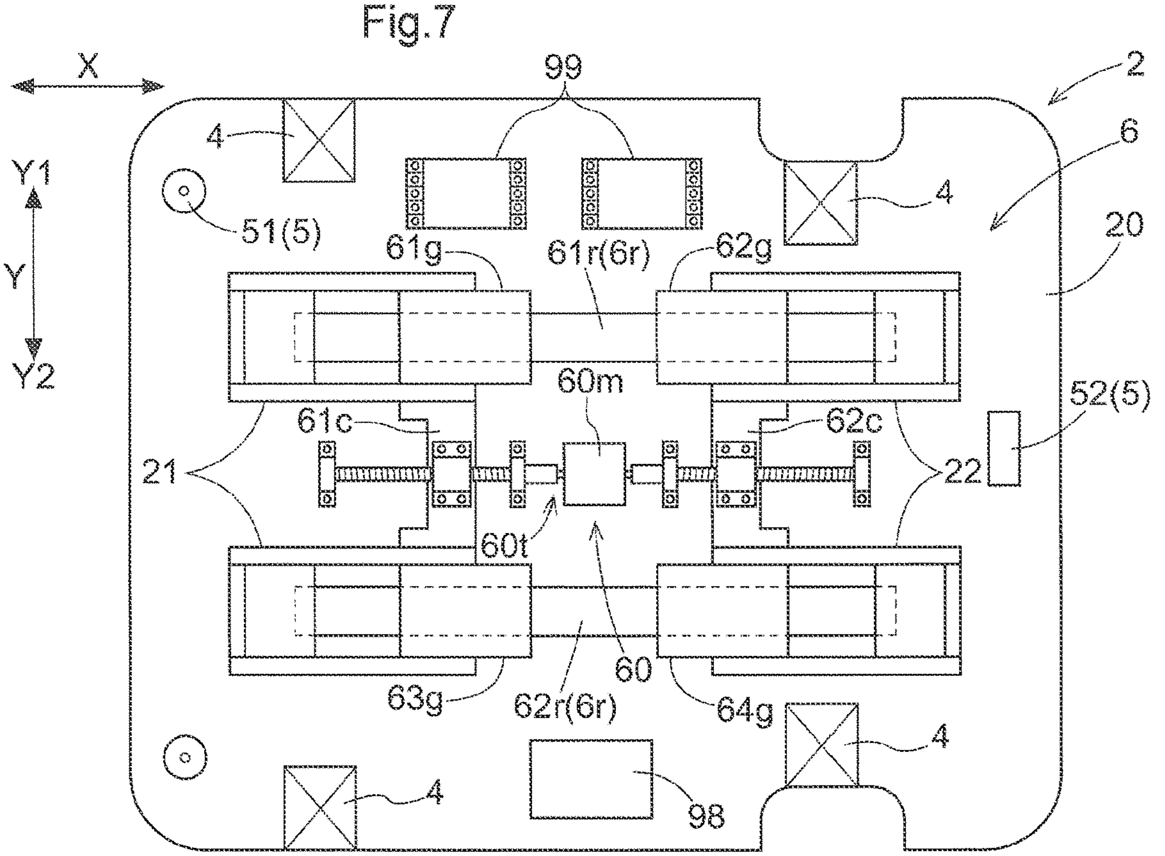
FIG. 7 is a bottom view of the holder.

The structure of the holder drive 6 will now be described in detail. FIG. 7 is a bottom view of the holder 2, showing its main components. For ease of clarifying the structure of the holder drive 6, wiring W and bridges 7 (described later) are not shown in FIG. 7.

As shown in FIG. 7, the holder drive 6 includes rails 6*r* extending in a direction in which the first holder members 21 and the second holder members 22 move and a drive 60 that moves the first holder members 21 and the second holder members 22 along the rails 6*r*.

In the present embodiment, as described above, the first holder members 21 and the second holder members 22 move in the horizontal direction. The rails 6*r* thus extend in the horizontal direction. In the present embodiment, the holder drive 6 includes a first rail 61*r* and a second rail 62*r* extending in the direction (hereafter, a holder member moving direction X) in which the pair of first holder members 21 and the pair of second holder members 22 move. In other words, the rails 6*r* include the first rail 61*r* and the second rail 62*r*. The first rail 61*r* and the second rail 62*r* extend in the horizontal direction and are parallel to each other. The first rail 61*r* and the second rail 62*r* are spaced from each other in a direction (hereafter, an orthogonal direction Y) orthogonal to the holder member moving direction X as viewed in the vertical direction. The orthogonal direction Y includes a first orthogonal direction Y1 and a second orthogonal direction Y2 opposite to the first orthogonal direction Y1. The first rail 61*r* is located in the first orthogonal direction Y1 from the second rail 62*r*. The second rail 62*r* is located in the second orthogonal direction Y2 from the first rail 61*r*.

In the present embodiment, the holder drive 6 includes a motor 60*m* and a transmission 60*t* that transmits a driving force from the motor 60*m* to the pair of first holder members 21 and the pair of second holder members 22. The drive 60 includes the motor 60*m* and the transmission 60*t*.

In the present embodiment, the motor 60*m* and the transmission 60*t* are located between the first rail 61*r* and the second rail 62*r*. In other words, the drive 60 is located between the first rail 61*r* and the second rail 62*r* in the orthogonal direction Y.

In the present embodiment, the holder drive 6 includes a first guide 61*g* and a second guide 62*g* movable along the first rail 61*r* and a third guide 63*g* and a fourth guide 64*g* movable along the second rail 62*r*.

In the present embodiment, the first guide 61*g* and the third guide 63*g* are connected to each other with a first connector 61*c* and move integrally. The first connector 61*c* receives a driving force from the motor 60*m* and moves in the holder member moving direction X. This causes the first guide 61*g* and the third guide 63*g* to move together in the holder member moving direction X. In the present embodiment, the transmission 60*t* includes a ball screw assembly. The first connector 61*c* is movably supported by a screw in the ball screw assembly.

One of the pair of first holder members 21 is supported by the first guide 61*g*. The other of the pair of first holder members 21 is supported by the third guide 63*g*. Thus, when the transmission 60*t* transmits a driving force from the motor 60*m* to the first connector 61*c*, the first guide 61*g* and the third guide 63*g* move integrally in the same direction, causing the pair of first holder members 21 to move.

In the present embodiment, the second guide 62*g* and the fourth guide 64*g* are connected to each other with a second connector 62*c* and move integrally. The second connector 62*c* receives a driving force from the motor 60*m* and moves in the holder member moving direction X. This causes the second guide 62*g* and the fourth guide 64*g* to move together in the holder member moving direction X. In the present embodiment, as described above, the transmission 60*t* includes the ball screw assembly. The second connector 62*c* is movably supported by a screw in the ball screw assembly.

One of the pair of second holder members 22 is supported by the second guide 62*g*. The other of the pair of second holder members 22 is supported by the fourth guide 64*g*. Thus, when the transmission 60*t* transmits a driving force from the motor 60*m* to the second connector 62*c*, the second guide 62*g* and the fourth guide 64*g* move integrally in the same direction, causing the pair of second holder members 22 to move.

The first connector 61*c* and the second connector 62*c* receiving a driving force from the motor 60*m* move toward and away from each other. The pair of first holder members 21 that move integrally with the first connector 61*c* and the pair of second holder members 22 that move integrally with the second connector 62*c* move toward and away from each other.

Figure 8:
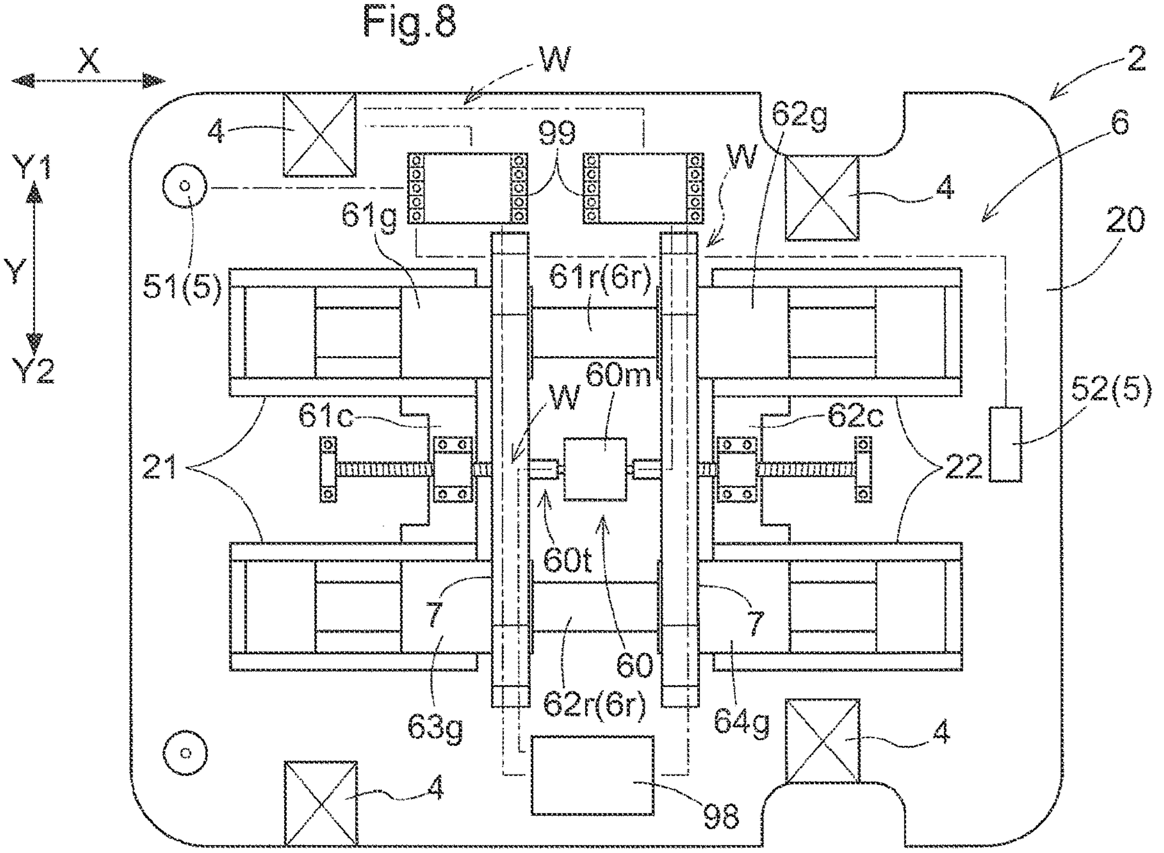
FIG. 8 is a diagram of the holder, showing its wiring structure.

FIG. 8 shows a wiring structure in the holder 2. In FIG. 8, the dot-dash lines represent main portions of the wiring W in the holder 2. The holder 2 may include wiring other than the wiring W shown in the figure. The wiring W includes a power line for supplying power to the components in the holder 2 and a signal line for transmitting and receiving signals.

In the present embodiment, the bridges 7 are located below the support 20. The bridges 7 cross the rails 6*r* as viewed in the vertical direction. The bridges 7 cross the rails 6*r* below the rails 6*r*. The bridges 7 extend in the orthogonal direction Y. In the present embodiment, the bridges 7 cross both the first rail 61*r* and the second rail 62*r* as viewed in the vertical direction. The bridges 7 connect an area in the first orthogonal direction Y1 from the first rail 61*r* and an area in the second orthogonal direction Y2 from the second rail 62*r*.

In the present embodiment, a pair of bridges 7 are located on the lower surface of the support 20. The pair of bridges 7 are spaced from each other in the holder member moving direction X and are parallel to each other. The pair of bridges 7 are located with the motor 60*m* in between in the holder member moving direction X. In the present embodiment, the motor 60*m* as viewed in the vertical direction is between the first rail 61*r* and the second rail 62*r* in the orthogonal direction Y and between the pair of bridges 7 in the holder member moving direction X.

In the present embodiment, the wiring W included on the support 20 is supported by the bridges 7. The wiring W is located below the support 20. In the present embodiment, the pair of bridges 7 each support the wiring W. The pair of bridges 7 allow the wiring W to be placed more freely. For example, one of the pair of bridges 7 may support the wiring W including the power line, and the other of the pair of bridges 7 may support the wiring W including the signal line. Each bridge 7 may be used for a different wire in the wiring W in this manner.

The bridges 7 support the wiring W across an area in the first orthogonal direction Y1 from the rails 6*r* and an area in the second orthogonal direction Y2 from the rails 6*r*. In the present embodiment, the pair of bridges 7 each support the wiring W across the area in the first orthogonal direction Y1 from the first rail 61*r* and the area in the second orthogonal direction Y2 from the second rail 62*r*.

In the present embodiment, the lift belt 3*a* including the feed line 97 is fastened to the support 20 with the belt fastener 4 (hereafter, a target belt fastener 4) at a position in the first orthogonal direction Y1 from the first rail 61*r*. In other words, the target belt fastener 4 is located in the area in the first orthogonal direction Y1 from the first rail 61*r*, and the feed line 97 is fastened to the target belt fastener 4. Power from the feed line 97 is supplied to the components in the holder 2 through the wiring W. In the present embodiment, terminal blocks 99 are located in the area in the first orthogonal direction Y1 from the first rail 61*r*. The wiring W from the target belt fastener 4 is connected to the terminal blocks 99. The wiring W from the target belt fastener 4 may include the signal line in addition to the power line. The wiring W from the first detector 51 and the wiring W from the second detector 52 are also connected to the terminal blocks 99.

In the present embodiment, a motor driver 98 for controlling the motor 60*m* is located in the area in the second orthogonal direction Y2 from the second rail 62*r*. The wiring W from the terminal blocks 99 are connected to the motor 60*m* and the motor driver 98 with the bridges 7. Although the first rail 61*r* is located between the terminal blocks 99 and the motor 60*m*, the bridges 7 allow the wiring W to connect the terminal blocks 99 and the motor 60*m*. Although the second rail 62*r* is located between the motor 60*m* and the motor driver 98, the bridges 7 allow the wiring W to connect the motor 60*m* and the motor driver 98.

As described above, the bridges 7 can prevent the wiring W located below the support 20 from interfering with the rails 6*r* or the drive 60.

Hereinafter, the other embodiments are described.

(1) In the above embodiment, the article detectors 5 that detect the article 8 as the holding target for the holder 2 include the first detector 51 and the second detector 52 having different detection structures. In some embodiments, the article detectors 5 may include the contact first detector 51 alone or the contactless second detector 52 alone.

(2) In the above embodiment, the rails 6*r* include the first rail 61*r* and the second rail 62*r*. In some embodiments, the rails 6*r* may be a single rail.

(3) In the above embodiment, the first connector 61*c* connects the pair of first holder members 21, and the second connector 62*c* connects the pair of second holder members 22. In some embodiments, the first connector 61*c* and the second connector 62*c* may be eliminated. The pair of first holder members 21 may be integral as a single member, and the pair of second holder members 22 may be integral as a single member.

(4) In the above embodiment, the bridges 7 cross both the first rail 61*r* and the second rail 62*r*. In some embodiments, one bridge 7 may cross the first rail 61*r*, and another bridge 7 may cross the second rail 62*r*.

(5) In the above embodiment, the wiring W includes the signal line for transmitting and receiving signals. In some embodiments, each component may transmit and receive signals wirelessly with, for example, an optical transmitter. In this case, the wiring W including the signal line is partly or fully eliminated.

(6) In the above embodiment, the lifter 3 includes four lift belts 3*a*, and the support 20 includes four belt fasteners 4 corresponding to the four lift belts 3*a*. In some embodiments, the lifter 3 may include, for example, three lift belts 3*a*. The support 20 may thus include three belt fasteners 4 corresponding to the three lift belts 3*a*.

(7) In the above embodiment, the first holder member 21 and the second holder member 22 move away from each other to hold the handles 81 and move toward each other to release the handles 81. In some embodiments, when, for example, the article 8 includes a single handle 81, the first holder member 21 and the second holder member 22 may move toward each other to hold the handle 81 and move away from each other to release the handle 81.

(8) In the above embodiment, the lift belt 3*a* is an example of an elongated member, and the belt fastener 4 is an example of an elongated member fastener. In some embodiments, the elongated member may be a wire. In this case, the elongated member fastener is a wire fastener.

(9) The structure described in each of the above embodiments may be combined with any other structures described in the other embodiments unless any contradiction arises. The embodiments described herein are merely illustrative in all aspects and may be modified variously as appropriate without departing from the spirit and scope of the present disclosure.

Overview of Present Embodiment

Hereinafter, a brief description of the present embodiment above is given.

A transport vehicle for traveling along a travel path to transport an article includes a holder that holds a handle on the article, and a lifter that lifts and lowers the holder. The lifter includes an elongated member suspending the holder and a lifting drive that winds and unwinds the elongated member to lift and lower the holder. The holder includes a support being a plate suspended parallel to a horizontal plane by the elongated member, at least one first holder member and at least one second holder member supported by the support and movable toward and away from each other, and a holder drive that drives the at least one first holder member and the at least one second holder member. The at least one first holder member and the at least one second holder member are located below the support. The holder drive is located in a space in a vertical direction below the support. The space includes the at least one first holder member and the at least one second holder member. The transport vehicle includes an elongated member fastener on the support. The elongated member fastener fastens the elongated member to the support. The elongated member fastener protrudes downward from the support.

In this structure, the first holder member and the second holder member are located below the support, and the holder drive is located in the space in the vertical direction including the first holder member and the second holder member. This allows the components of the holder to be efficiently located together below the support, allowing the entire holder to be easily downsized in the vertical direction. Additionally, the elongated member fastener for fastening the elongated member and the support together protrudes downward from the support. This allows fewer components to be located above the support, allowing the holder located inside the compartment to be nearer the lifting drive in the vertical direction. The entire transport vehicle can thus also be downsized in the vertical direction.

The transport vehicle may further include an article detector on the support. The article detector may detect the article as a holding target for the holder. The article detector may protrude upward from the support. The article detector may be at a position overlapping a space in the vertical direction including the lifting drive without overlapping the lifting drive as viewed in the vertical direction when the support is nearest the lifting drive in the vertical direction.

This structure can avoid interference between the lifting drive and the article detector and allows the support and the lifting drive to be near each other in the vertical direction. Thus, the structure including the article detector can be downsized in the vertical direction.

The at least one first holder member may include a pair of first holder members, and the at least one second holder member includes a pair of second holder members. The holder drive may include a first rail and a second rail extending in a direction in which the pair of first holder members and the pair of second holder members move, a first guide and a second guide movable along the first rail, a third guide and a fourth guide movable along the second rail, a motor, and a transmission that transmits a driving force from the motor to the pair of first holder members and the pair of second holder members. One of the pair of first holder members may be supported by the first guide, and one of the pair of second holder members may be supported by the second guide. The other of the pair of first holder members may be supported by the third guide, and the other of the pair of second holder members may be supported by the fourth guide. The motor and the transmission may be located between the first rail and the second rail.

This structure allows a linear mover including the rails extending in the direction in which the holder members move to move the pair of first holder members and the pair of second holder members. Thus, when the holder members move in the horizontal direction, for example, the rails also extend in the horizontal direction, allowing the entire holder drive to be easily downsized in the vertical direction. The two rails that can guide the four holder members also allow the holder drive to be easily downsized. Additionally, with the motor and the transmission located between the first rail and the second rail, a driving force from the single motor can drive four holder members in total. The holder members can thus be driven with fewer motors, allowing the holder drive to be easily downsized as well.

The holder drive may include a rail extending in a direction in which the first holder member and the second holder member move and a drive to move the first holder member and the second holder member along the rail. The transport vehicle may include a bridge below the support. The bridge may cross the rail as viewed in the vertical direction. The bridge may support wiring on the support.

In this structure, the bridge allows the wiring to be installed without interfering with the rails.

INDUSTRIAL APPLICABILITY

The technique according to one or more embodiments of the present disclosure is applicable to a transport vehicle that travels along a travel path to transport an article.

The invention claimed is:

1. A transport vehicle for traveling along a travel path to transport an article, the transport vehicle comprising:

a holder configured to hold a handle on the article; and a lifter configured to lift and lower the holder, and wherein:

the lifter comprises an elongated member suspending the holder and a lifting drive configured to wind and unwind the elongated member to lift and lower the holder, the holder comprises a support that is a plate suspended parallel to a horizontal plane by the elongated member, at least one first holder member and at least one second holder member supported by the support and movable toward and away from each other, and a holder drive configured to drive the at least one first holder member and the at least one second holder member, the at least one first holder member and the at least one second holder member are located below the support, the holder drive is located in a space in a vertical direction below the support, the space including the at least one first holder member and the at least one second holder member, the transport vehicle comprises an elongated member fastener on the support, the elongated member fastener fastening a lower end of the elongated member to the support, and the elongated member fastener protrudes downward from the support and is arranged, in a moving direction in which the first holder member and the second holder member move, within a space in which the first holder member or the second holder member is located, and is spaced apart, as viewed in the vertical direction, in a direction orthogonal to the moving direction from the region in which the first holder member or the second holder member is located.

2. The transport vehicle according to claim 1, further comprising:

an article detector on the support, the article detector configured to detect the article as a holding target for the holder, wherein the article detector protrudes upward from the support, and wherein the article detector is at a position overlapping a space in the vertical direction including the lifting drive without overlapping the lifting drive as viewed in the vertical direction when the support is nearest the lifting drive in the vertical direction.

3. The transport vehicle according to claim 2, wherein:

the article detector comprises at least one of a first detector and a second detector, wherein the first detector is configured to detect a position of the article by coming into contact with the handle on the article and is located on an upper surface of the support, and wherein the second detector is configured to detect a position of the article in a contactless manner by detecting the handle on the article and is located above the support.

4. The transport vehicle according to claim 3, wherein:

the second detector comprises a second sensor configured to detect a vertical relative distance between the holder and the handle in a contactless manner, and a support member supporting the second sensor; and the support member is located on an upper surface of the support and supports the second sensor above the support.

5. The transport vehicle according to claim 1, wherein:

the at least one first holder member comprises a pair of first holder members and the at least one second holder member comprises a pair of second holder members, the holder drive comprises a first rail and a second rail extending in a direction in which the pair of first holder members and the pair of second holder members move, a first guide and a second guide movable along the first rail, a third guide and a fourth guide movable along the second rail, a motor, and a transmission configured to transmit a driving force from the motor to the pair of first holder members and the pair of second holder members, one of the pair of first holder members is supported by the first guide, and one of the pair of second holder members is supported by the second guide, the other of the pair of first holder members is supported by the third guide, and the other of the pair of second holder members is supported by the fourth guide, and the motor and the transmission are located between the first rail and the second rail.

6. The transport vehicle according to claim 5, wherein:

the motor is located between one end of the first rail and the other end of the first rail in a holder member moving direction in which the pair of first holder members and the pair of second holder member move.

7. A transport vehicle for traveling along a travel path to transport an article, the transport vehicle comprising:

a holder configured to hold a handle on the article; and a lifter configured to lift and lower the holder, and wherein:

the lifter comprises an elongated member suspending the holder and a lifting drive configured to wind and unwind the elongated member to lift and lower the holder, the holder comprises a support that is a plate suspended parallel to a horizontal plane by the elongated member, at least one first holder member and at least one second holder member supported by the support and movable toward and away from each other, and a holder drive configured to drive the at least one first holder member and the at least one second holder member, the at least one first holder member and the at least one second holder member are located below the support, the holder drive is located in a space in a vertical direction below the support, the space including the at least one first holder member and the at least one second holder member, the transport vehicle comprises an elongated member fastener on the support, the elongated member fastener fastening the elongated member to the support, the elongated member fastener protrudes downward from the support, the holder drive comprises a rail extending in a direction in which the first holder member and the second holder member move and a drive to move the first holder member and the second holder member along the rail, the transport vehicle comprises a bridge below the support, the bridge crosses the rail as viewed in the vertical direction, and the bridge supports wiring on the support.

* * * * *